(12) United States Patent
Fukuhara

(10) Patent No.: US 7,786,004 B2
(45) Date of Patent: Aug. 31, 2010

(54) METHOD OF TREATING AN EXPOSED CONDUCTIVE FILM PRIOR TO FORMING A SILICIDE

(75) Inventor: Jota Fukuhara, Mie (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 252 days.

(21) Appl. No.: 11/871,481

(22) Filed: Oct. 12, 2007

(65) Prior Publication Data

US 2008/0305630 A1    Dec. 11, 2008

(30) Foreign Application Priority Data

Oct. 13, 2006   (JP)  ............................. 2006-280185

(51) Int. Cl.
*H01L 21/4763* (2006.01)
(52) U.S. Cl. ...................... 438/630; 438/655; 438/664; 257/757; 257/E21.199; 257/E21.593
(58) Field of Classification Search .......... 438/664.655, 438/630; 257/295, 757, E29.161, E21.593, 257/E21.199
See application file for complete search history.

(56) References Cited

U.S. PATENT DOCUMENTS 5,661,056 A * 8/1997 Takeuchi .................... 438/261

6,326,291 B1 * 12/2001 Yu .............................. 438/592
2001/0005029 A1 * 6/2001 Kanamori .................... 257/315
2006/0035463 A1 * 2/2006 Crank et al. ................. 438/683

FOREIGN PATENT DOCUMENTS

JP         2005-286155         10/2005

OTHER PUBLICATIONS

U.S. Appl. No. 12/117,231, filed May 8, 2008, Nagano.
U.S. Appl. No. 12/125,546, filed May 22, 2008, Matsunaga, et al.

* cited by examiner

*Primary Examiner*—Thao X Le
*Assistant Examiner*—Tanika Warrior
(74) *Attorney, Agent, or Firm*—Oblon, Spivak, McClelland, Maier & Neustadt, L.L.P.

(57) ABSTRACT

A method of manufacturing a semiconductor device includes forming a first conductive film on a semiconductor substrate via a first insulating film; forming a second conductive film on the first conductive film via a second insulating film; patterning the first and the second conductive films and the second insulating film to form a plurality of gate electrodes; filling a third insulating film between the plurality of gate electrodes; exposing an upper portion of the second conductive film by removing the third insulating film; covering surfaces of the exposed upper portion of the second conductive film with fluoride (F) or carbon (C) or oxygen (O); and forming a metal film on an upper surface of the second conductive film; and forming silicide layers on the upper portion of the second conductive films by thermally treating the metal film.

16 Claims, 18 Drawing Sheets

METHOD OF TREATING AN EXPOSED CONDUCTIVE FILM PRIOR TO FORMING A SILICIDE

CROSS-REFERENCE TO RELATED APPLICATIONS

This application is based upon and claims the benefit of priority from the prior Japanese Patent Application No. 2006-280185, filed on, Oct. 13, 2006 the entire contents of which are incorporated herein by reference.

FIELD

The present disclosure is directed to a method of manufacturing a semiconductor device having a silicide layer on the upper portion of the gate electrode.

BACKGROUND

A typical example of a semiconductor device having a silicide layer on the upper portion of the gate electrode is disclosed for example in JP 2005-286155 A. The disclosed device has a silicide layer composed of materials such as tungsten silicide (WSi) provided on the upper portion of the memory transistor gate electrode. The provision of the silicide layer reduces the resistivity of the control gate electrode composed of materials such as polycrystalline silicon film.

Narrower interconnect width owning to recent device densification calls for further reduction in resistivity. Alternative silicide material to address lower resistivity are metal material such as titanium (Ti), nickel (Ni), and cobalt (Co).

These alternative materials, unlike tungsten, have low melting point. Thus, considering their sensitivity to thermal processing, they need to undergo silicide treatment later in the process flow instead of being formed as titanium silicide ($TiSi_2$) nickel silicide (NiSi) and cobalt silicide ($CoSi_2$) films in one go. Hence, titanium film, nickel film, or the cobalt film is formed and thermally processed to form a self aligning silicide after fabricating the gate electrode configuration.

In siliciding titanium film, nickel film or cobalt film formed over the polycrystalline silicon film, the exposed surface of the polycrystalline silicon film is cleaned by DHF (Dilute HF) to promote reaction between the metal film and the polycrystalline film.

However, the wet process by DHF, for example, introduces the following problems, for instance, when the thickness of the silicide layer is increased. In a NAND flash memory, the breakdown voltage relative to the ONO (oxide nitride oxide) film serving as an inter-gate insulating film in the context of interconnect function is reduced, whereas in case of a logical element, increase in junction leak is observed.

SUMMARY

The present disclosure provides a method of manufacturing a semiconductor device that increases controllability of silicide layer thickness when forming the silicide layer by thermally treating a metal film on an upper portion of a polycrystalline film.

The method of manufacturing a semiconductor device of the present disclosure includes forming a first conductive film on a semiconductor substrate via a first insulating film; forming a second conductive film on the first conductive film via a second insulating film; patterning the first and the second conductive films and the second insulating film to form a plurality of gate electrodes; filling a third insulating film between the plurality of gate electrodes; exposing an upper portion of the second conductive film by removing the third insulating film; covering surfaces of the exposed upper portion of the second conductive film with fluoride (F) or carbon (C) or oxygen (O); and forming a metal film on an upper surface of the second conductive film; and forming silicide layers on the upper portion of the second conductive films by thermally treating the metal film.

BRIEF DESCRIPTION OF THE DRAWINGS

Other objects, features and advantages of the present disclosure will become clear upon reviewing the following description of the embodiment of the present disclosure with reference to the accompanying drawings, in which.

DETAILED DESCRIPTION

One embodiment employing the present disclosure to a NAND flash memory will be described with reference to the drawings. References are made to the drawings hereinafter with identical or similar reference symbols when referring to identical or similar elements. Of note is that the drawings are merely schematic and the relation between the thickness and the planar dimensions and the ratio in thickness of each layer differs from the actual ratio.

A description will be given on the configuration of the NAND flash memory of the present embodiment.

Figure 1:
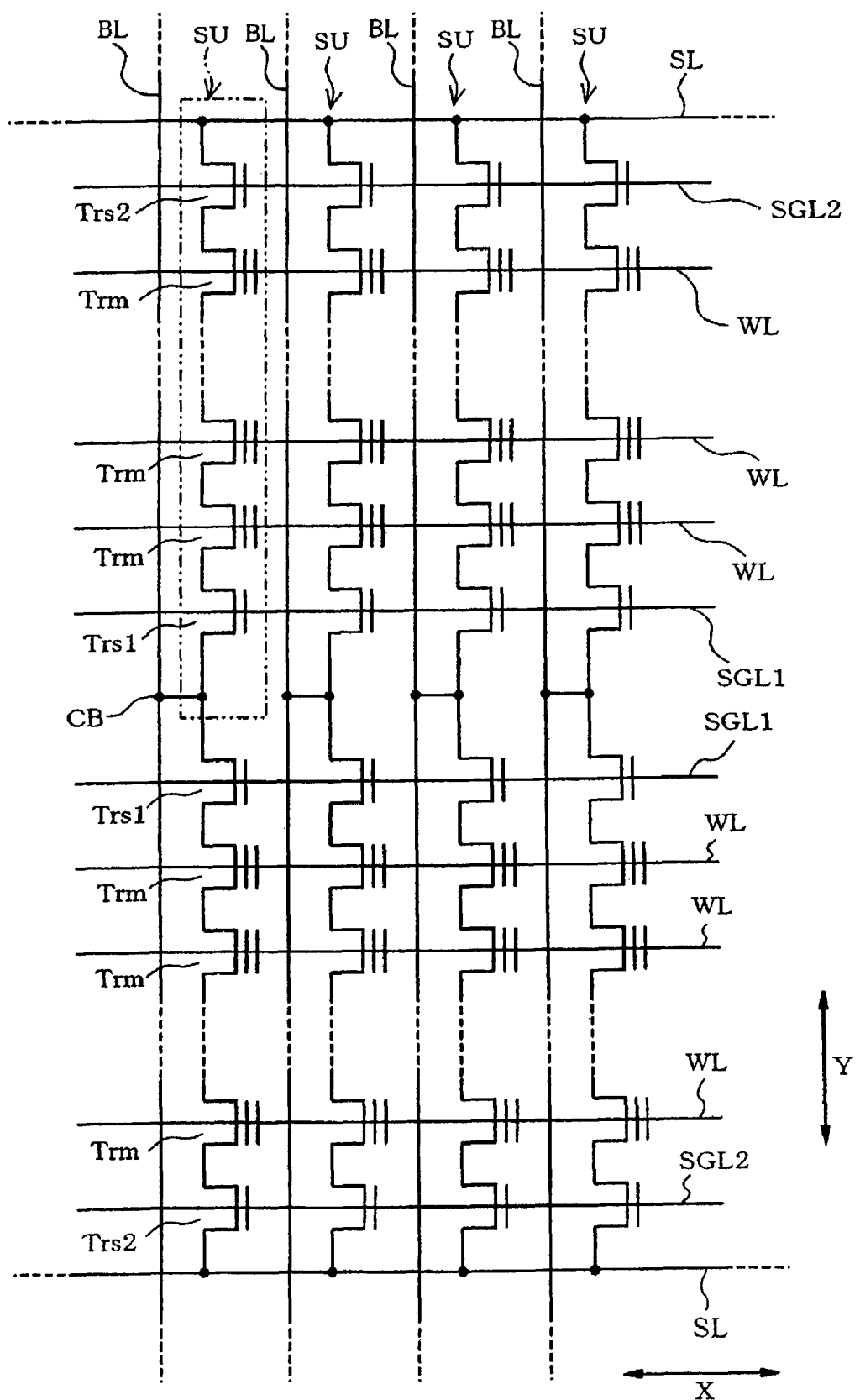
FIG. 1 is an equivalent circuit representing a portion of the a memory cell array of a NAND type flash memory indicating a first embodiment of the present disclosure.

FIG. 1 illustrates an equivalent circuit representing a portion of a memory cell array formed in the memory cell region of the NAND flash memory.

The memory cell array of the NAND flash memory is configured by a matrix of NAND cell units SU. The NAND cell unit SU is constituted by two select gate transistors Trs1 and Trs2, and a plurality (eight for example: nth power of 2 (n is a positive integer)) of memory cell transistors Trm connected in series between the two select gate transistors Trs1 and Trs2. The plurality of neighboring memory cell transistors Trm shares the source/drain regions within a single NAND cell unit SU.

Referring to FIG. 1, the memory cell transistors Trm aligned in an X-direction (corresponding to word line direction and gate width direction) are coupled to a common word line (control gate line) WL. Also, the select gate transistors Trs1 aligned in the X-direction in FIG. 1 are coupled to a common select gate line SGL1. The select gate transistors Trs2 are coupled to a common select gate line SGL2. A bit line contact CB is coupled to a drain region of the select gate transistor Trs1. The bit line contact CB is coupled to a bit line BL extending in the Y-direction (corresponding to the gate length direction and the bit line direction) perpendicularly crossing the X-direction indicated in FIG. 1. The select gate transistor Trs2 is connected to a source line SL extending in the X direction of FIG. 1 via the source region.

Figure 2:
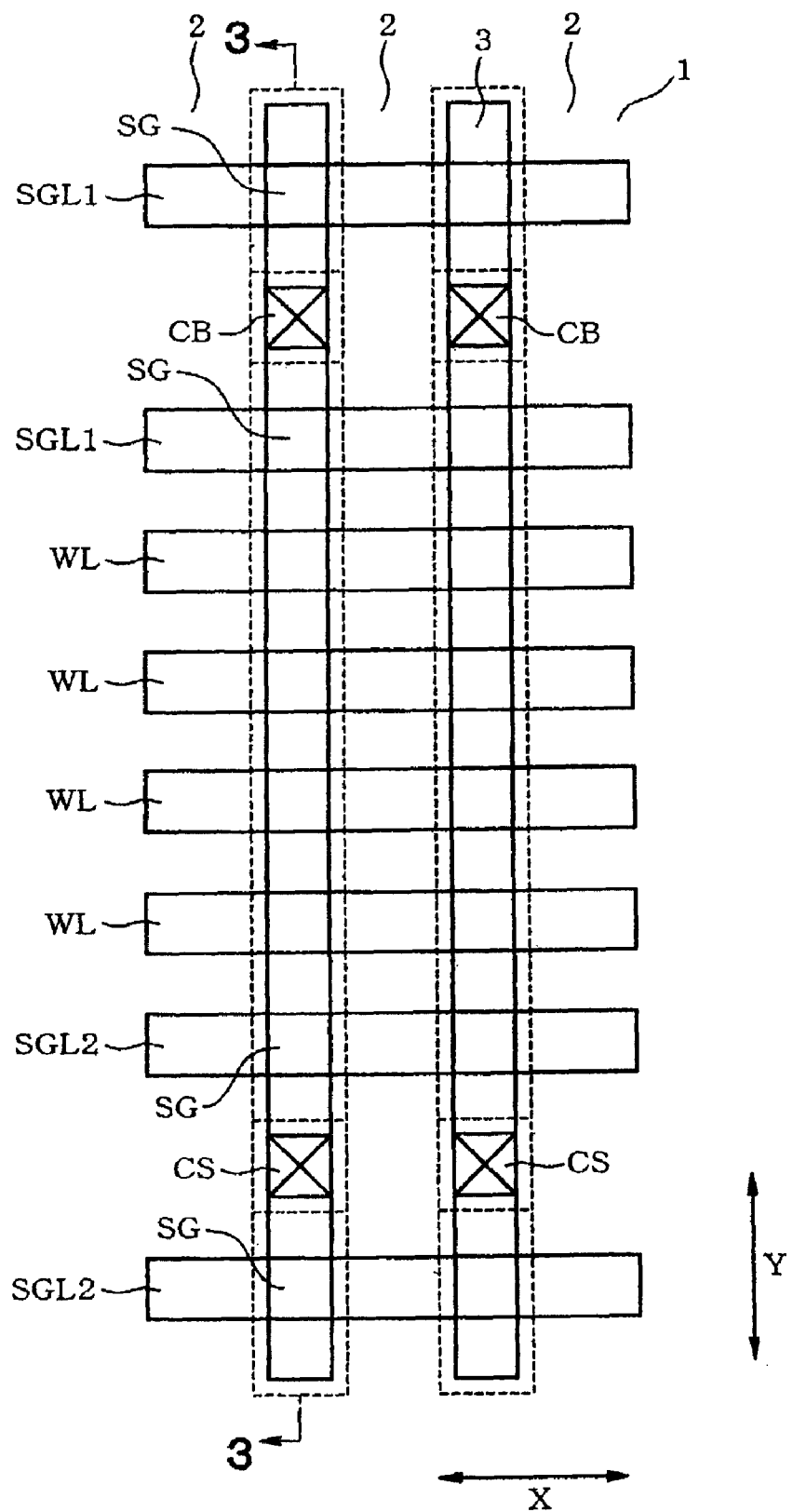
FIG. 2 is a schematic plan view indicating a partial layout of a memory cell region.

FIG. 2 is a plan view indicating a layout of a portion of the memory cell. A plurality of STIs 2 (shallow trench isolation) serving as an element isolation region is formed at predetermined intervals along the Y-direction as viewed in FIG. 2 to form active regions 3 in the X-direction as viewed in FIG. 2. Word lines WL of memory cell transistors are formed at predetermined intervals along the X-direction as viewed in FIG. 2 perpendicular to the active region 3.

Also, a pair of select gate lines SGL 1 for a pair of select gate transistors is formed along the X-direction as viewed in FIG. 2. Bit line contacts CB are formed in the active region 3 between the pair of select gate lines SGL1. A gate electrode MG of the memory cell transistor is formed at the crossover of the active region 3 and the word line WL, and a gate electrode SG is formed at the crossover of the active region 3 and the select gate line SGL 1.

Figure 3:
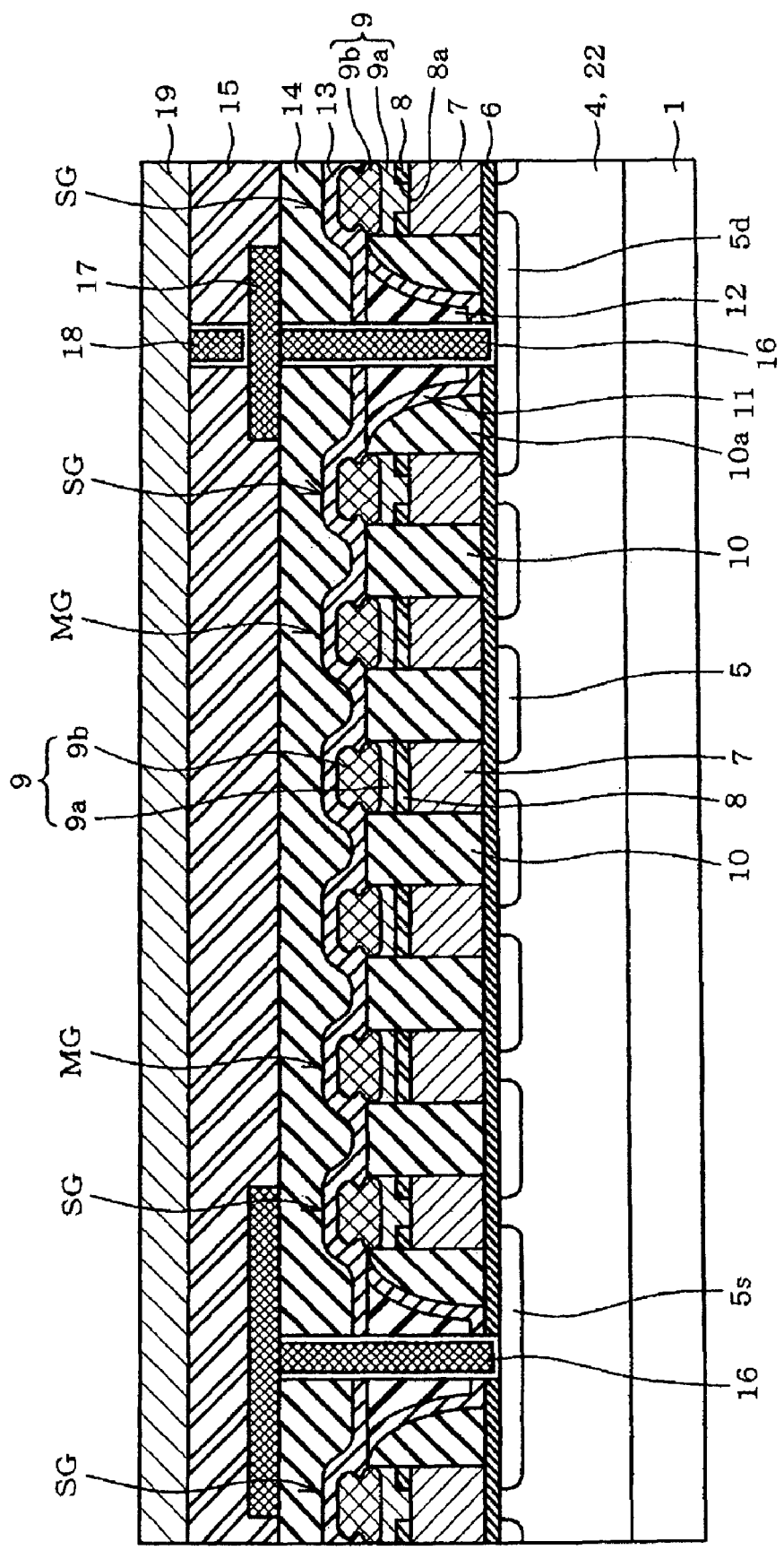
FIG. 3 is a cross sectional view taken along line 3-3 of FIG. 2.

FIG. 3 is a cross sectional view of the memory cell array of the present embodiment taken along line 3-3 (bit line direction) of FIG. 2. As can be seen in FIG. 3, the NAND cell unit SU is formed in a well 4 provided in the silicon substrate 1. The Gate electrode MG for each memory cell transistor and gate the electrode SG for each select gate transistor are formed on a gate insulating film 6 serving as a first insulating film overlying the silicon substrate 1. Each of the gate electrode MG and SG are connected in the bit line direction (Y-direction as viewed in FIG. 2) via a diffusion layer 5 formed in the silicon substrate 1.

The gate electrode MG of the memory cell transistor includes a floating gate electrode 7 constituting a charge storing layer, an inter-gate insulating film 8 serving as a second insulating film formed on the floating gate electrode 7, and a control gate electrode 9 formed on the inter-gate insulating film 8.

The control gate electrode 9 takes a laminated structure of a polycrystalline silicon layer 9a and a silicide layer 9b comprising a cobalt disilicide ($CoSi_2$), for example. The width of the silicide layer 9b underside in contact with the polycrystalline silicon layer 9a is configured at a greater width than the silicide layer 9b upper surface. Further, the silicide layer 9b is formed in an hourglass shape having a constriction between the upper surface and the lower surface thereof; the constriction being configured at narrower width than the silicide layer 9b upper surface. The control gate electrode 9 is connected to the gate electrode MG of the NAND cell unit SU neighboring the control gate electrode 9 in the direction normal to FIG. 3 and functions as the word line WL.

The gate electrode SG of the select gate transistor formed at each end of the NAND cell unit SU takes a similar structure as the gate electrode MG of the memory cell transistor, except that an opening 8a is defined by removing a portion of the inter-gate insulating film 8. The opening 8a provides an electrical connection between the floating gate electrode 7 and the control gate electrode 9.

A third insulating film 10 is formed on the silicon substrate 1 so as to fill the gaps between the gate electrodes MG provided in each memory cell transistor, and the gaps between the gate electrodes SG of the select gate transistors and the neighboring gate electrodes MG of the memory cell transistors. The height of the third insulating film upper surface from the silicon substrate 1 surface is arranged higher than the silicide layer 9b underside but lower than the height of the constriction of the silicide layer 9b. A spacer 10a is formed on the sidewall of the gate electrodes SG in the regions between the gate electrodes SG of the select gate transistors. The spacer 10a is composed of the first insulating film 10. A first barrier insulating film 11 is formed so as to cover the spacer 10a surface.

A fourth insulating film 12 is formed on the upper portion of the first barrier insulating film 11 so as to fill the gaps between the gate electrodes SG of the select gate transistors. The fourth insulating film 12 is filled in the gaps between the gate electrodes SG at a height substantially at level with the height of the third insulating film 10 formed between the gate electrodes MG. Furthermore, a second barrier insulating film 13 is formed across the upper surfaces of the foregoing configurations, more specifically, over the upper surface of the silicide layer 9b of the gate electrodes MG and gate electrodes SG of the memory cell transistors and the select gate transistors respectively, the upper surface of the third insulating film 10 between the gate electrodes MG, and the upper surface of the fourth insulating film 12 between the gate electrodes SG. A first interlayer insulating film 14 is formed over the second barrier insulating film 13. A second interlayer insulating film 15 is formed on the first interlayer insulating film 14. A bit line 19 is formed over the second interlayer insulating film 15.

A bit line contact diffusion layer 5d of the select gate transistor establishes connection with the bit line 19 via the bit line contact electrode 16 penetrating the fourth insulating film 12 and the first interlayer insulating film 14, and the bit line connection 17 and the inter-interconnect contact electrode 18 buried in the second interlayer insulating film 15. Also, the source line contact diffusion layer 5s of the select gate transistor establishes connection with the source line 21 formed on the first interlayer insulating film 14 via the source line contact electrode 20 penetrating the fourth insulating film 12 and the first interlayer insulating film 14.

As described above, the silicide layer 9b provided on the upper portion of the gate electrodes MG and SG are configured to have a constriction in the mid portion between its upper surface and the lower surface. Thus, the silicide layer 9b can be formed with reduced thickness as well as achieving low-resistance interconnecting and suppressing excessive silicide reaction, thereby preventing reduction in breakdown voltage or junction leak current even in case cobalt disilicide ($CoSi_2$) is formed by the reaction of polycrystalline silicon film with cobalt film.

Next, one example of steps for manufacturing a NAND flash memory in accordance with the present embodiment will be described in detail with reference to the cross sectional views taken along bit line direction illustrated in FIGS. 4 to 17.

Figure 4:
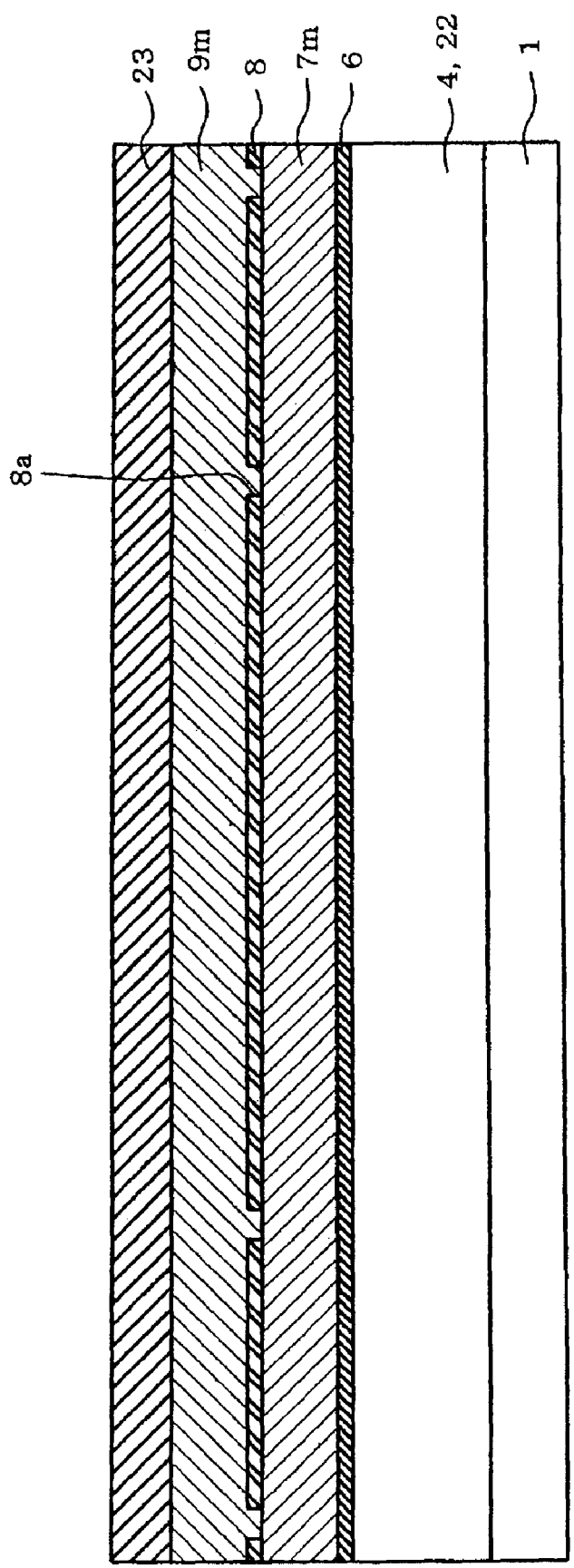
FIG. 4 is a schematic vertical cross sectional view showing one phase of a manufacturing step.

Referring to FIG. 4, materials for forming the gate electrodes MG and SG are deposited on the silicon substrate 1 having a well 4 and an element isolation region 2 formed thereto.

Firstly, the p-type well 4 and the STI 2 (not shown) for element isolation is formed on the silicon substrate 1. Then, the gate insulating film 6 and the first conductive film 7m are deposited entirely over the isolated active regions 22 of the silicon substrate 1 and thereafter processed into elongate strips oriented in the bit line direction (Y direction in FIG. 2) by lithography and etch process. Then, the inter-gate insulating film 8, the second conductive film 9m and the fifth insulating film 23 are formed further on top in listed sequence.

The gate insulating film 6 functions as a tunnel oxide film of the memory cell transistor and comprises a silicon oxide film ($SiO_2$ film) in a thickness of 8 nm, for example. The first conductive film 7m is processed into a floating gate electrode 7, and the second conductive film 9m is processed into a portion of the control gate electrode 9. Polycrystalline silicon highly doped with phosphorous (P) or boron (B) is employed as the first and the second conductive films 7m and 9m. The so called ONO film may be employed as the inter-gate insulating film 8. The ONO film is composed of laminated layers of silicon oxide film ($SiO_2$ film)/silicon nitride film ($Si_3N_4$ film)/silicon oxide film ($SiO_2$ film), for example, each layer being configured at a thickness of 3 nm to 10 nm, for example.

The fifth insulating film 23 constituted by silicon nitride film ($Si_3N_4$), for example, is used as a mask when patterning the gate electrode MG. Prior to forming the second conductive film 9m, an opening 8a is defined by removing a portion of the inter-gate insulating film 8 of the region constituting the gate electrode SG of the select gate transistor. The opening 8a provides electrical connection between the floating gate electrode 7 and the control gate electrode 9.

Figure 5:
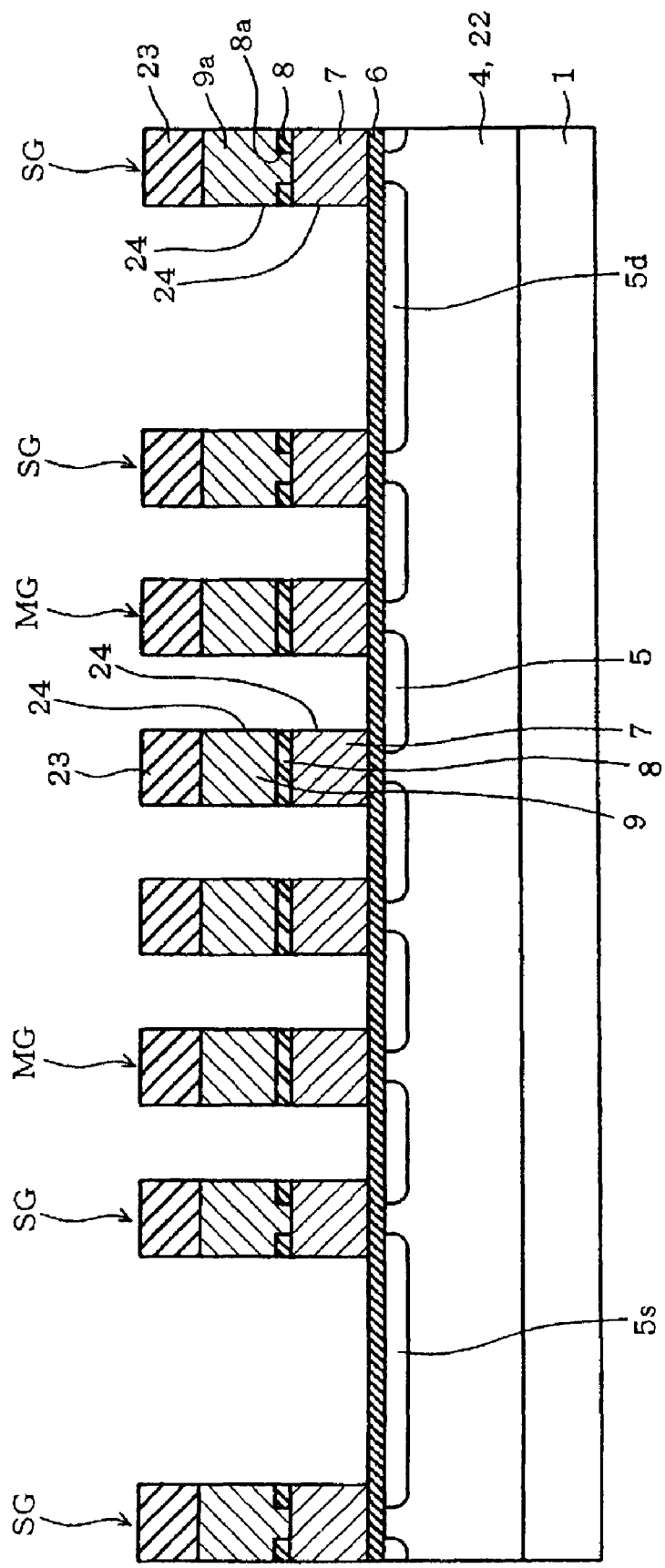
FIG. 5 is a schematic vertical cross sectional view showing one phase of a manufacturing step ($2^{nd}$ variation)

Next, referring to FIG. 5, the gate electrode is patterned to form a diffusion region between the gate electrodes.

First, gate electrode patterns are formed on the fifth insulating film 23 by lithography and etch process. Subsequently, the gate electrodes MG and SG of the memory cell transistor and select gate transistor respectively are formed by etching the second conductive film 9m, the inter-gate insulating film 8, and the first conductive film 7m using the fifth insulating film 23 as a mask. The formation of the gate electrodes MG and SG result in formation of the floating gate electrode 7 from the first conductive film 7m, and the formation of the second conductive layer 9a constituting a portion of the control gate electrode 9 from the second conductive film 9, respectively. Also, the above described etch process exposes the gate insulating film 6 overlying the silicon substrate 1 surface situated between the gate electrodes MG and SG.

Further, post-oxidation is performed to form a post-oxidation film 24 over the surface of the laminated gate electrodes MG and SG for recovering the damages suffered by the etch process executed during gate electrode processing.

Then, using the gate electrodes G and SG as masks, diffusion layers 5, 5d, and 5s are formed in the portion of the silicon substrate 1 situated between the gate electrodes G by doping impurities by ion implantation. The diffusion layers 5d and 5s constitute a bit line contact diffusion layer and a source line contact diffusion layer, respectively. The doped impurities may be n-type arsenic (As) or phosphorous (P). In case the well 4 is of an n-type, p-type impurities such as boron (B) or boron fluoride ($BF_2$) may be used, for example.

The diffusion layer 5 provides electrical connection between the gate electrode SG of the select gate transistor and the gate electrode MG of the memory cell transistor within the memory cell array. The ion implantation for forming the diffusion layer may be performed after post-oxidation as described earlier. or before post-oxidation.

Figure 6:
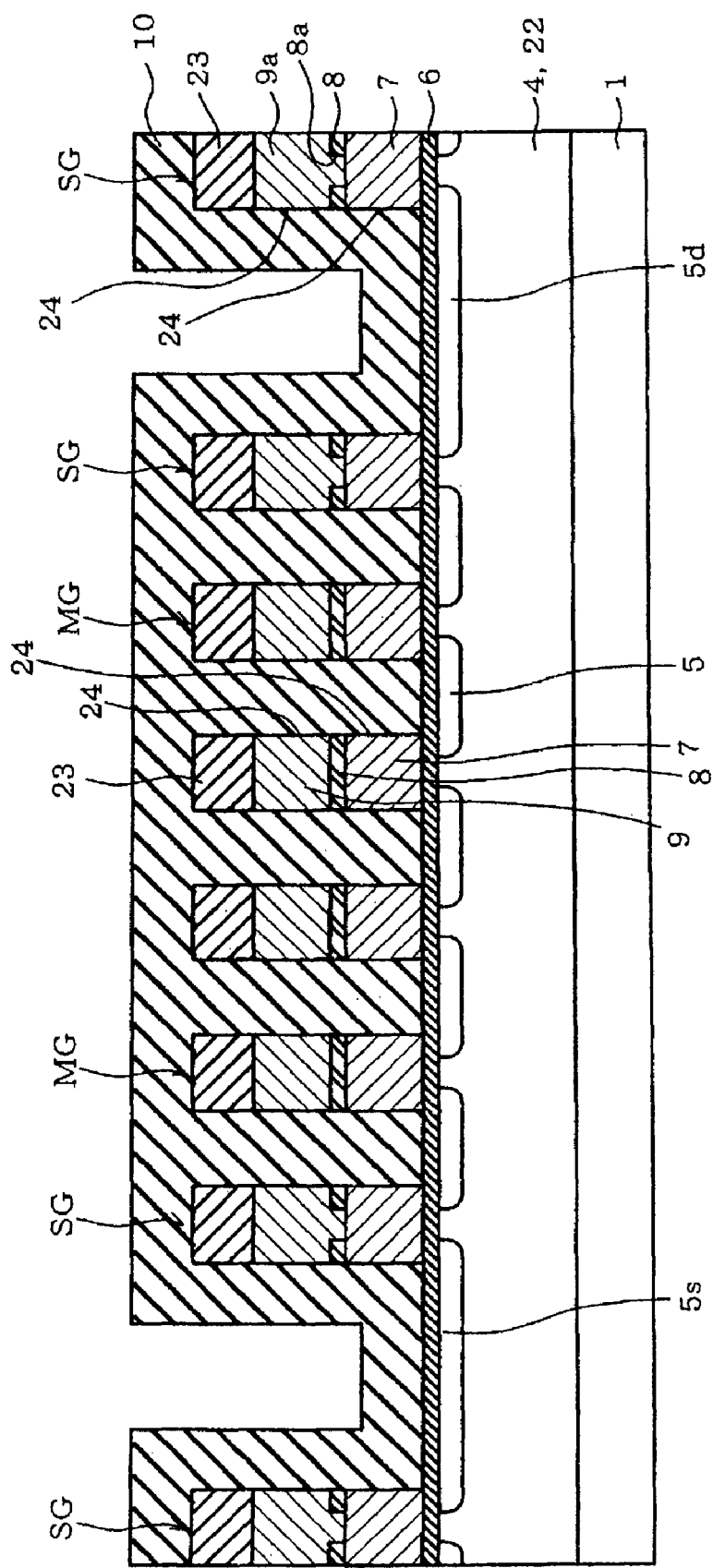
FIG. 6 is a schematic vertical cross sectional view showing one phase of a manufacturing step ($3^{rd}$ variation)

Referring to FIG. 6, the first insulating film 10 is formed between the gate electrodes MG of the memory cell transistor.

First, the third insulating film 10 is deposited across the entire surface of the underlying structure. The thickness of the third insulating film 10 is in a magnitude to fully fill the gaps between the gate electrodes MG of the memory cell transistors, but not enough to fully fill the contact region where the bit line and the source line contact diffusion layers 5d and 5s are formed. In other words, the third insulating film 10 is formed in a thickness greater than ½ the spacing between the gate electrodes MG of the memory cell transistor but less than the ½ the width of the contact diffusion layers 5d and 5s. A TEOS (tetraethyl orthosilicate) based silicon oxide film ($SiO_2$ film) or a low-dielectric insulating film may be used as a third insulating film 10, for example. The third insulating film 10 may be formed by depositing a plurality of layers of silicon oxide films of different types.

Figure 7:
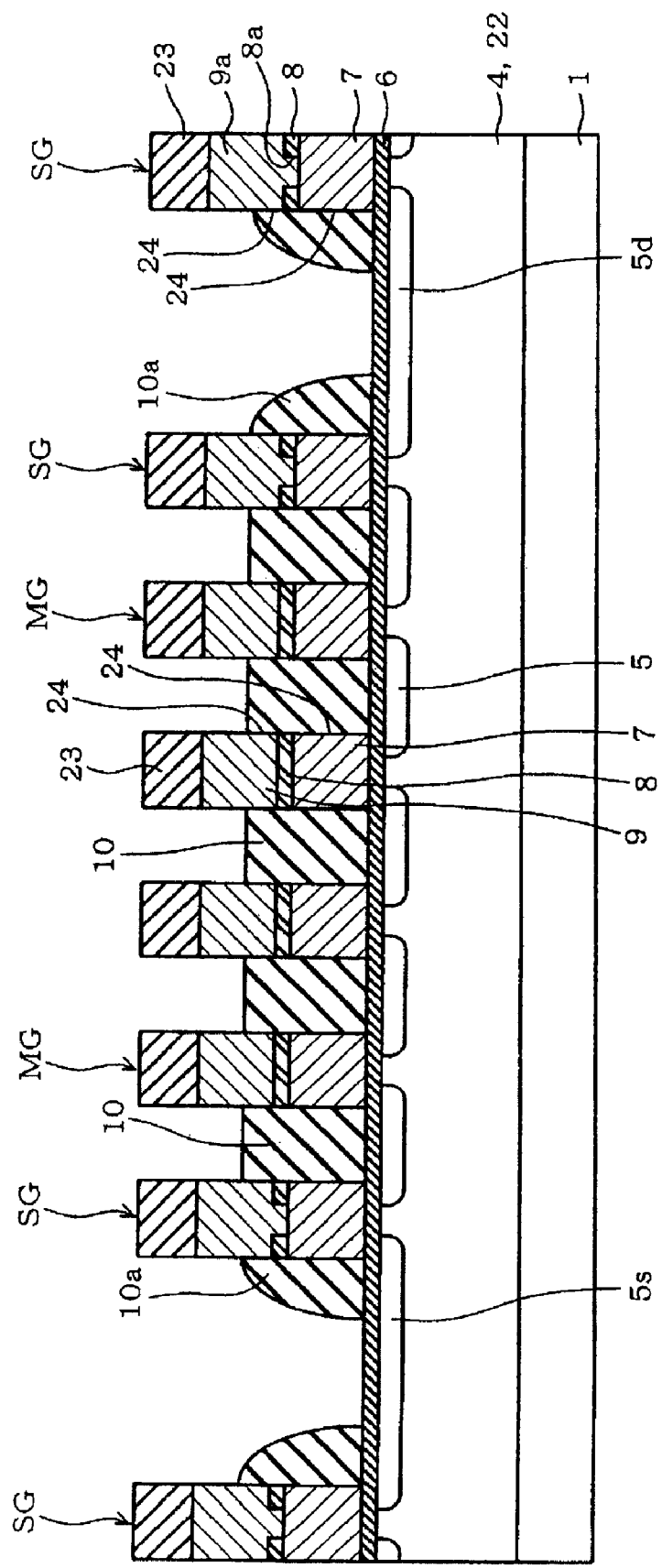
FIG. 7 is a schematic vertical cross sectional view showing one phase of a manufacturing step ($4^{th}$ variation)

Then, as illustrated in FIG. 7, the third insulating film 10 is etched back.

More specifically, the third insulating film 10 is etched anisotropically to be etched back to the height of the side surface of the control gate electrode 9. The height of the third insulating film 10 after the etch process is lower than the boundary of the second conductive film 9a and the fifth insulating film 23 constituting the mask insulating film, but higher than the boundary of the inter-gate insulating film 8 and the second conductive film 9a. The above described etch process forms a sidewall insulating film 10a on the gate electrode SG side surface of the select gate transistor of the contact region. The gate insulating film 6 in the central portion of the contact diffusion layers 5d and 5s are exposed by etching back the third insulating film 10.

In the portion of the gate electrode MG above the third insulating film 10, the post-oxidation film 24 formed on the gate electrode MG side surface is also etched to expose the side surface of the second conductive film 9a.

Figure 8:
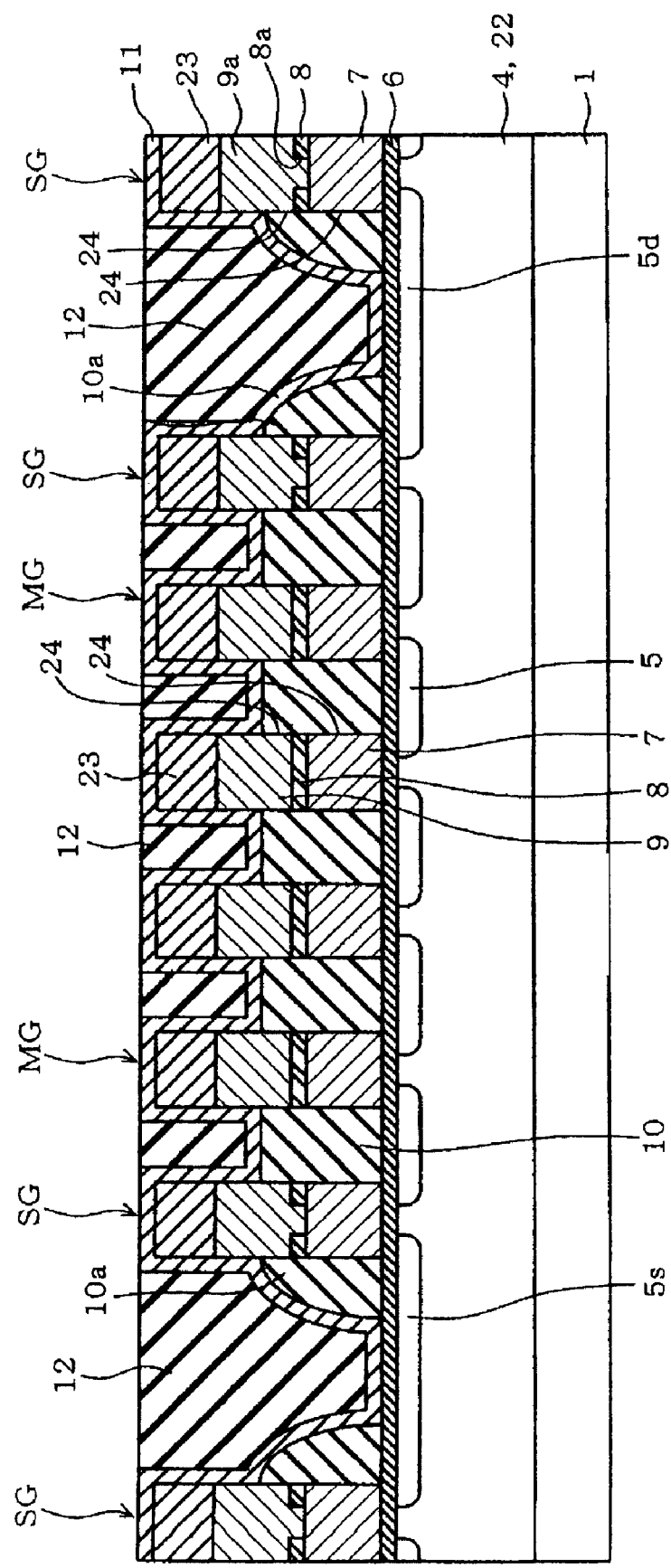
FIG. 8 is a schematic vertical cross sectional view showing one phase of a manufacturing step ($5^{th}$ variation)

Next, referring to FIG. 8, a first barrier insulating film 11 is formed on the third insulating film 10, and the entire structure is planarized by the fourth insulating film 12.

The first barrier insulating film 11 is formed over the third insulating film 10 so as to cover the exposed gate electrodes MG and SG, and over the exposed gate insulating film 6 in the central portion of the contact diffusion layers 5d and 5s. The etch rate of the first barrier insulating film 11 varies from that of the third insulating film 10. The first barrier film 11 comprises an insulating film providing barrier to hydrogen, one example of which is a silicon nitride film. The first barrier insulating film 11 is in direct contact with the second conductive film 9a which is the portion exposed in an earlier process step. Thus, as illustrated in FIG. 8, the first barrier insulating film 11 is formed in a U-shape in the region between the gate electrodes MG of the memory cell transistor. An extremely thin natural oxide film may possibly be formed on the side surface of the second conductive film 9a, however, it does not cause introduction of hydrogen into the gate electrode G. Hence, it can be assumed in this case also that the first barrier insulating film 11 is in direct contact with the second conductive film 9a.

Thereafter, a thick fourth insulating film 12 is deposited entirely over the first barrier insulating film 11 and the gaps between the gate electrodes MG are filled with the fourth insulating film 12. The fourth insulating film 12 may comprise an insulating film suitable for planarization of deep and wide gaps, such as BPSG (boro-phospho-silicate glass). The fourth insulating film 12 deposited above the gate electrodes MG and SG is planarized by removing the fourth insulating film 12 by CMP (chemical mechanical polishing) using the first barrier insulating film 11 as a stopper. CMP may be performed by using the fifth insulating film 23 as a stopper.

Next, the silicide layer 9b is formed on the upper portion of the gate electrodes MG and SG.

Figure 9:
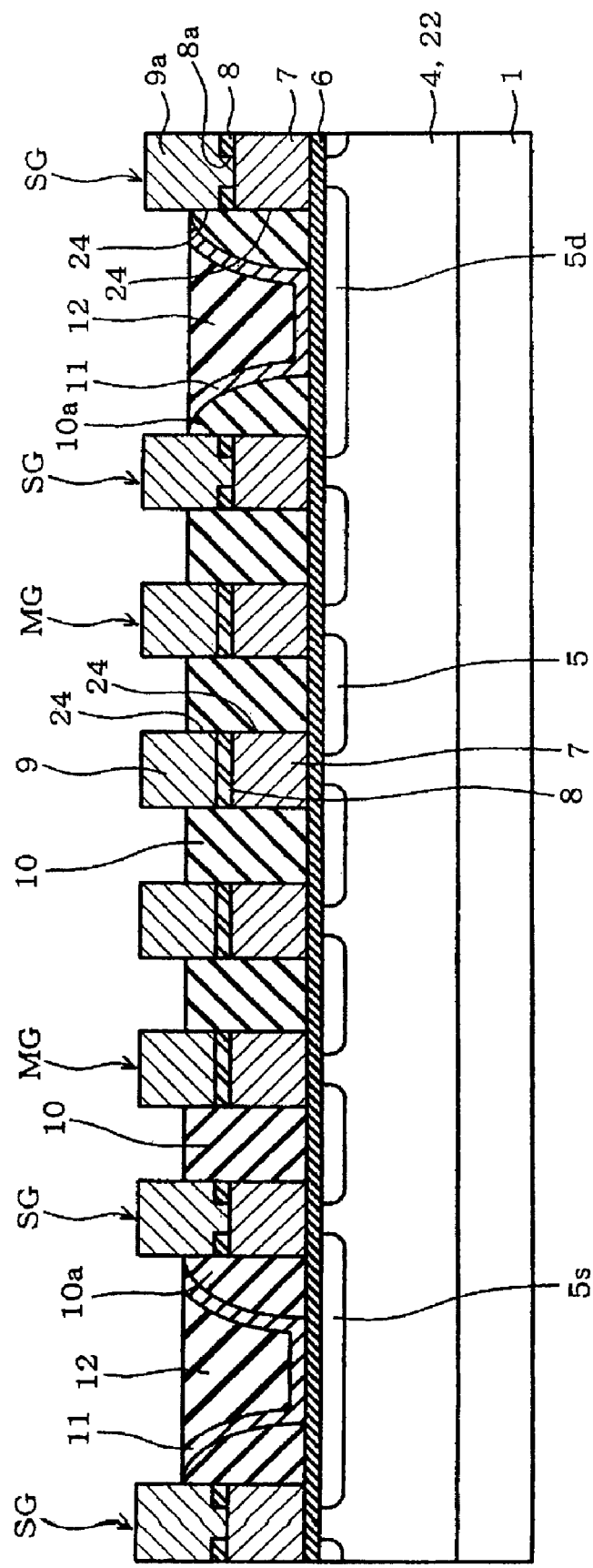
FIG. 9 is a schematic vertical cross sectional view showing one phase of a manufacturing step ($6^{th}$ variation)

Referring to FIG. 9, first, the first barrier insulating film 11 over the gate electrodes MG and SG, the fifth insulating film 23 and the fourth insulating film 12 are etched away to expose the upper portion of the second conductive film 9a. The fifth insulating film 23 and the first barrier insulating film 11 are etched simultaneously since they are both formed by silicon nitride film ($Si_3N_4$), for example. Thereafter, silicon cleaning is performed by fluorinated acid (HF), for example.

Figure 10:
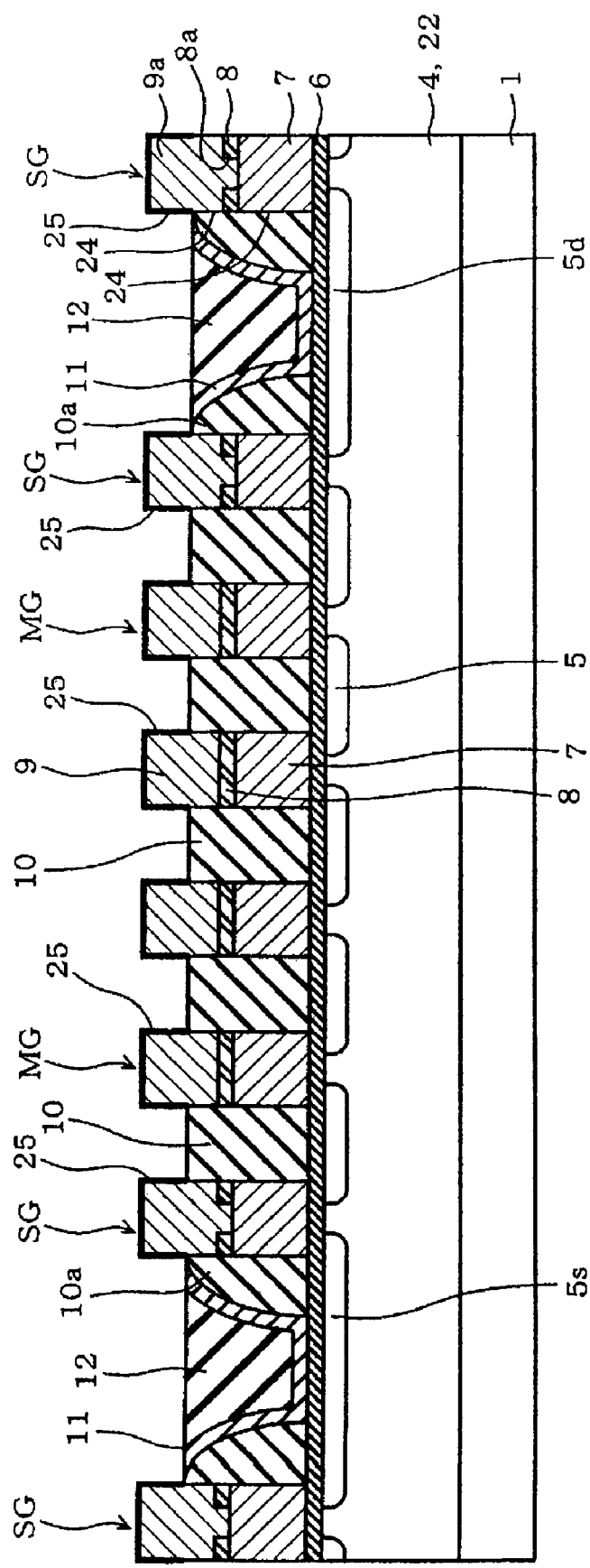
FIG. 10 is a schematic vertical cross sectional view showing one phase of a manufacturing step ($7^{th}$ variation)

Next, referring to FIG. 10, cobalt (Co)/titanium (Ti)/nitride titanium (TiN) film are formed consecutively by sputtering process; however, prior to the film formation, a fluoridized/oxidized layer 25 is formed. More specifically, the second conductive film 9a is exposed to a parallel plate plasma generated by carbon tetrafluoride ($CF_4$) gas or oxygen ($O_2$) gas or $CF_4/O_2$ mixture gas (or each of the gas including inactive gas) under several 100 m Torr to several Torr to fluoridize or oxidize the second conductive film 9a surface to form the fluoridized/oxidized layer 25. The fluoridized/oxidized layer 25 is a silicon oxide film including fluoride (F).

The gases used for fluoridizing or oxidizing are subject to the following conditions, for example. Trifluoronitride ($NF_3$) gas is flown in the amount of 25 to 500 SCCM (standard cc/min), nitrogen ($N_2$) gas in 25 to 500 SCCM (standard cc/min) and hydrogen ($H_2$) gas in 15 to 700 SCCM, under 200 to 300 Pa with a microwave output of 500 to 4000 W. Hydrogen gas is flown in the amount of 15 to 700 SCCM when flown as it is, and in about 10 to 200 SCCM when flown as ammonia ($NH_3$) gas, which meets the aforementioned condition when converted to hydrogen ($H_2$) gas equivalent. Conditions for anneal takes a temperature range of 150 to 350 degrees Celsius for a duration of 30 seconds to 10 minutes. Anneal may be performed under a temperature range of 200 to 300 degrees Celsius to provide favorable results.

Figure 11:
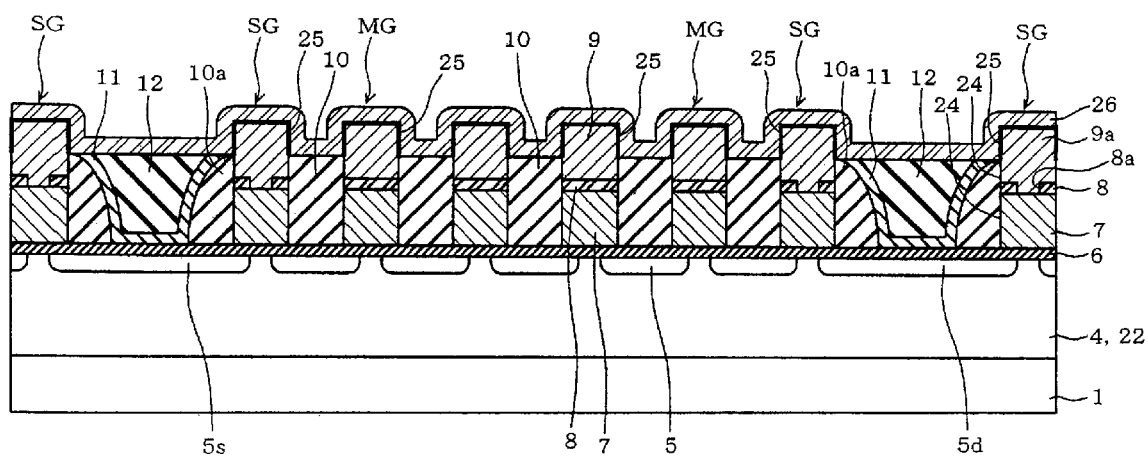
FIG. 11 is a schematic vertical cross sectional view showing one phase of a manufacturing step ($8^{th}$ variation)

Then, referring to FIG. 11, cobalt/titanium/titanium nitride film 26 is formed over the second conductive film 9a, the third insulating film 10 and the fourth insulating film 12 as illustrated in FIG. 11 by consecutive sputtering. Thereafter, the cobalt/titanium/titanium nitride film 26 is thermally treated by RTA (Rapid Thermal Anneal) in the temperature range of approximately 500 to 600 degrees Celsius for 0.5 to 5 minutes to form a cobalt silicide (CoSi) film. Thereafter, non-reactive cobalt film, titanium film, and titanium nitride film are removed by using sulfuric ($H_2SO_4$)/hydrogen peroxide ($H_2O_2$) mixture liquid and thermally treated again by RTA in the range of 750 degrees to 850 degrees Celsius for 0.5 to 5 minutes to form the silicide layer 9b comprising a cobalt disilicide ($CoSi_2$) film.

Figure 12:
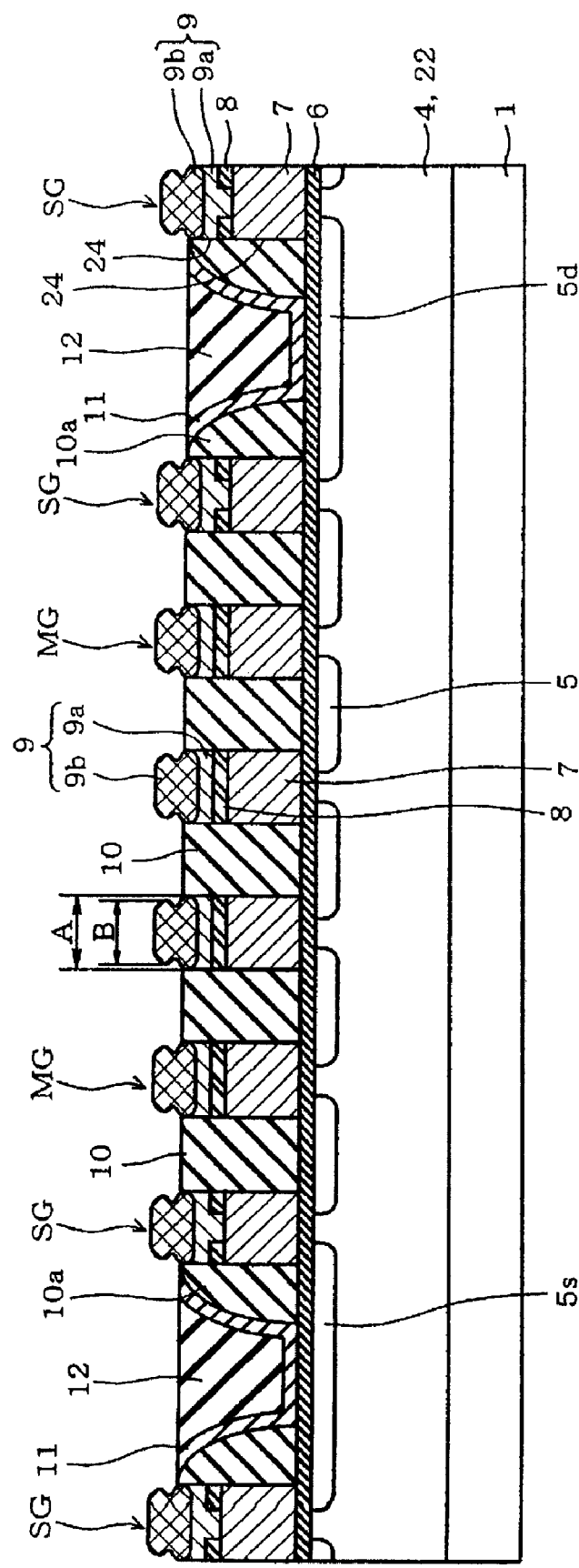
FIG. 12 is a schematic vertical cross sectional view showing one phase of a manufacturing step ($9^{th}$ variation)

Referring to FIG. 12, the silicide layer 9b thus formed has an upper surface of width B which is narrower than width A of its lower surface. The silicide layer 9b further has a constriction of narrower width compared to width A and width B at the mid portion thereof. It is presumed that such configuration is attributable to suppressing of excessive reaction between the polycrystalline film constituting the second conductive layer 9a and the cobalt film by the aforementioned fluoridizing/oxidizing process. Thus, the polycrystalline film is prevented from becoming too thin by excessive silicidation, and allows improvement in break down voltage of the ONO film.

Figure 17A:
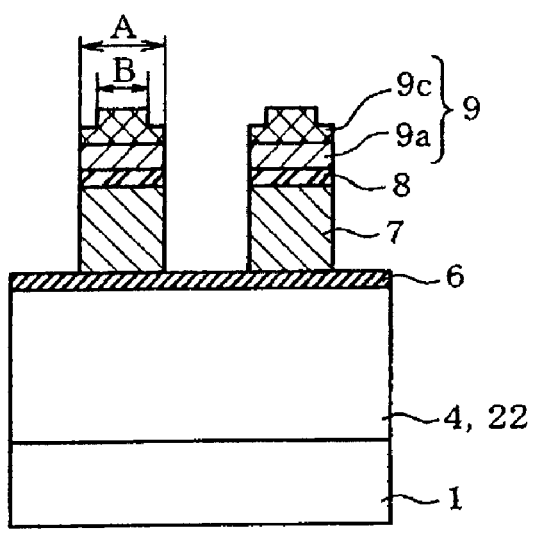
FIGS. 17A and 17B illustrate cross sectional forms of silicide layers.
Figure 17B:
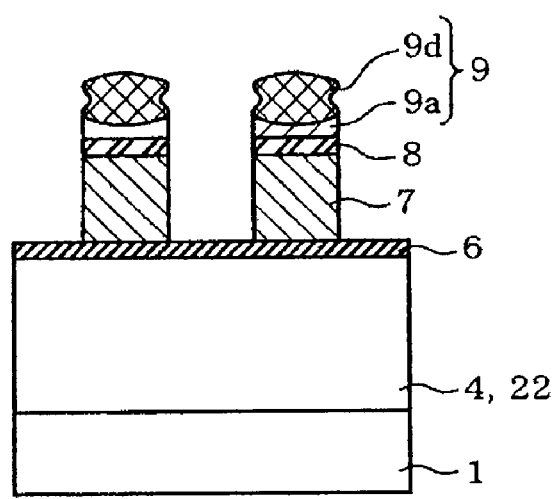

The silicide layer 9b may be formed as silicide layers 9c and 9d as illustrated in FIGS. 17A and 17B instead. FIG. 17 illustrates a portion of the gate electrode MG, describing in particular the various shapes which may be taken by the silicide layers 9c and 9d. The shape of the silicide layer 9c illustrated in FIG. 17A is stepped at the mid portion of the cobalt disilicide ($CoSi_2$) reactive layer, such that width A of the lower surface side is greater than width B of the upper surface side with no aforementioned constriction. The shape of the silicide layer 9d illustrated in FIG. 17B has curved upper and lower surfaces having a constriction in the mid portion.

As can be seen form above, the control gate electrode 9 is formed by laminating the silicide layer 9b on the second conductive layer 9a. When forming the silicide layer 9b with a cobalt disilicide ($CoSi_2$), execution of additional high temperature thermal processing after removing the non-reactive metal allows disilicidation ($CoSi_2$) to render interconnecting in lower resistance compared to cobalt silicide (CoSi) film.

Next, a contact electrode 16 and a first interconnect 17 are formed.

Figure 13:
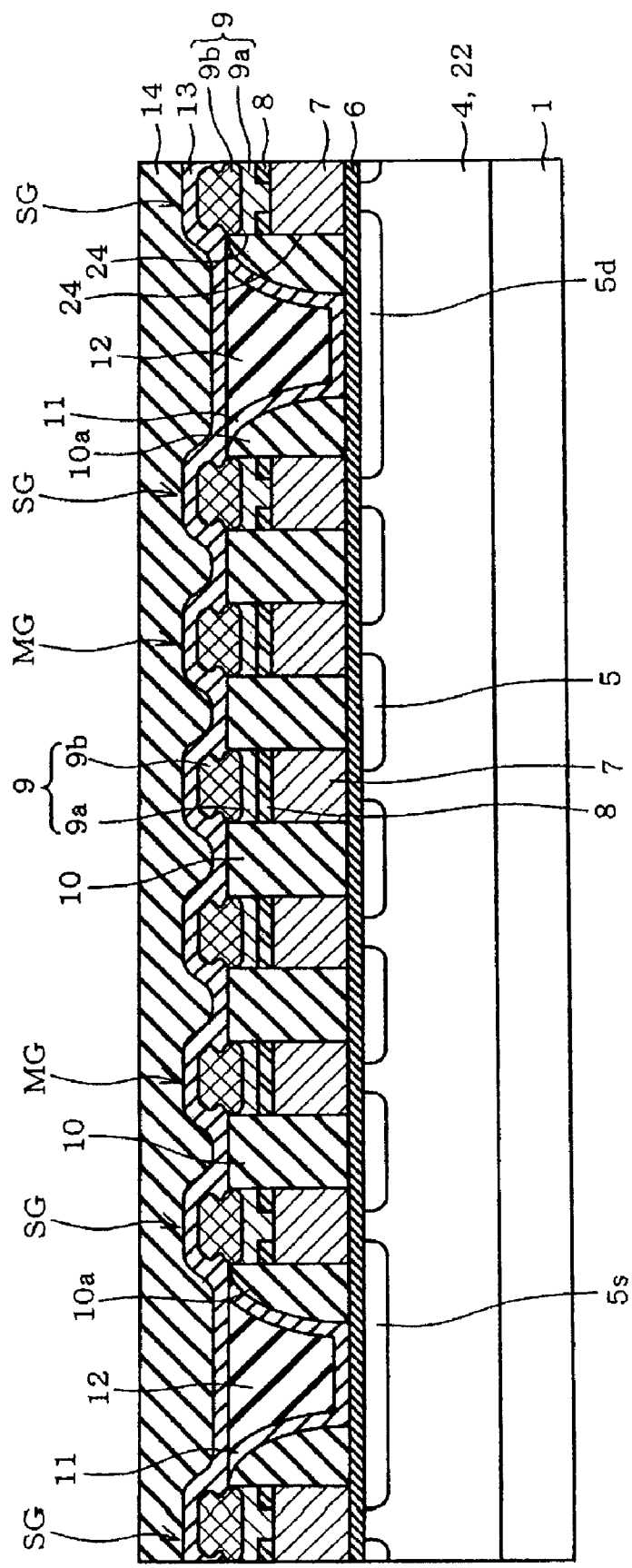
FIG. 13 is a schematic vertical cross sectional view showing one phase of a manufacturing step ($10^{th}$ variation)
Figure 14:
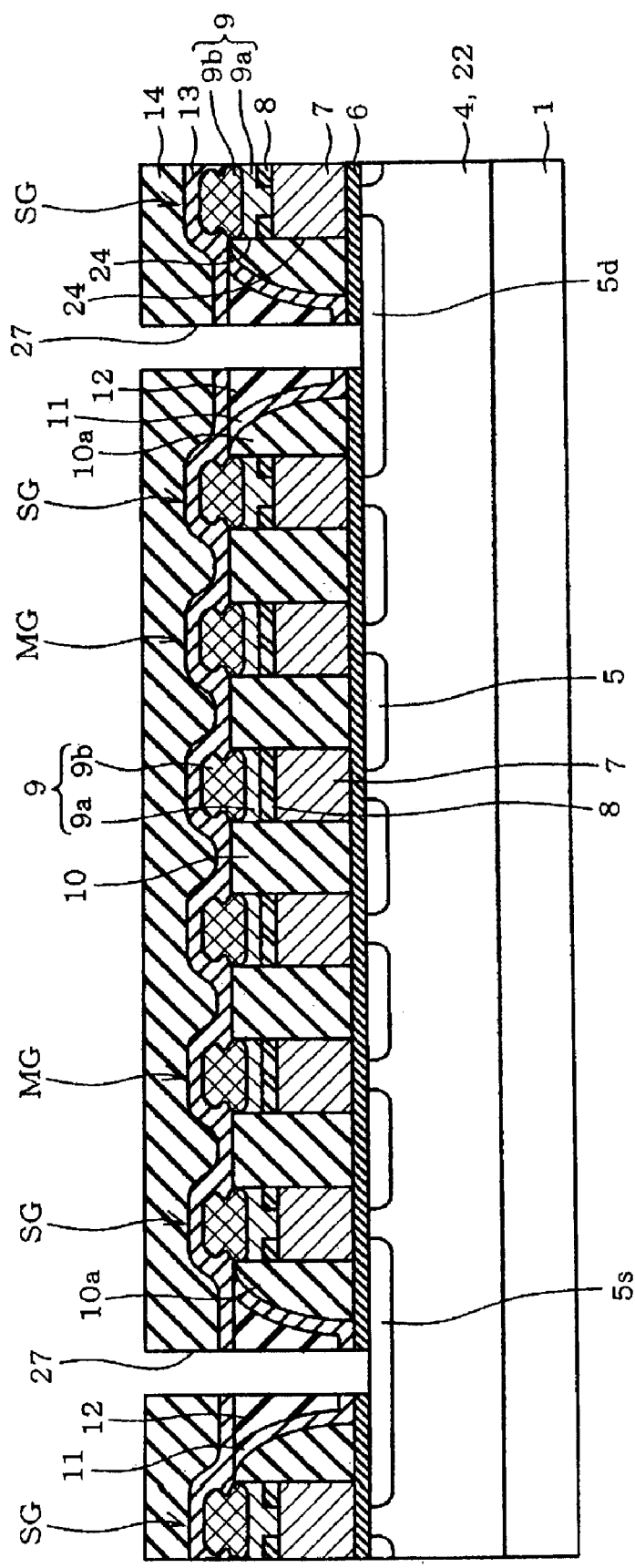
FIG. 14 is a schematic vertical cross sectional view showing one phase of a manufacturing step ($11^{th}$ variation)

Referring to FIG. 13, the second barrier insulating film 13 is formed over the second conductive film 9a, the third insulating film 10, and the fourth insulating film 12, whereafter the first interlayer insulating film 14 is deposited entirely over the second barrier insulating film 13 and thereafter planarized as required. Then, as illustrated in FIG. 14, a contact hole 27 is defined through the first interconnect insulating film 14 to obtain contact with the bit line contact diffusion layer 5d and the source line contact diffusion layer 5s. The contact hole 27 is formed by etching the first interlayer insulating film 14 by using the second barrier insulating film 13 as an etch stopper and thereafter etching the second barrier insulating film 13.

Then, the fourth insulating film 12 is etched in accordance with the vertical sequence of the layers by using the first barrier insulating film 11 as an etch stopper. The use of the first barrier insulating film 11 as an etch stopper prevents unintended etching of the element isolation insulating film even when the contact hole 27 is misaligned. Thereafter, the first barrier insulating film 11 and the gate insulating film 6 are etched in sequence to expose the bit line contact diffusion layer 5d and the source line contact diffusion layer 5s.

Figure 15:
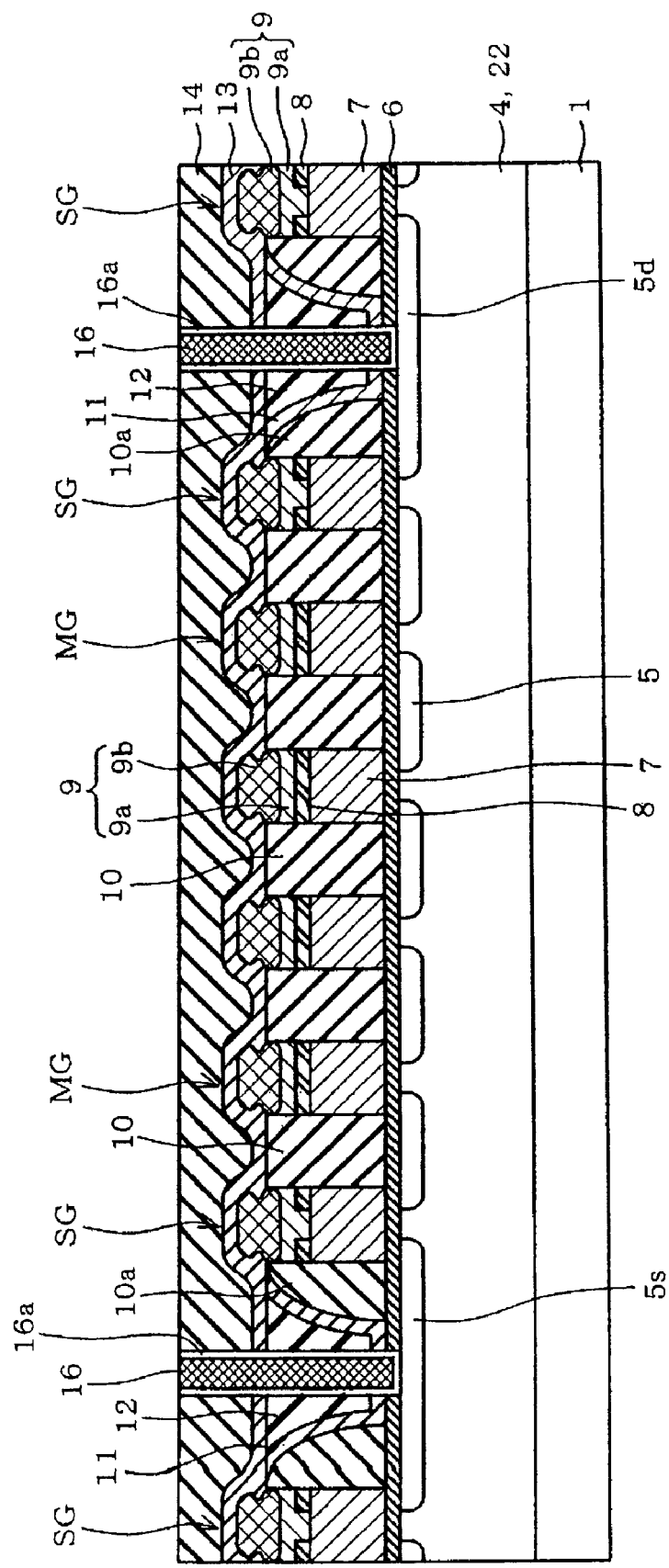
FIG. 15 is a schematic vertical cross sectional view showing one phase of a manufacturing step ($12^{th}$ variation)

Next, referring to FIG. 15, the contact hole 27 is filled with contact electrode metal. Metal such as aluminum (Al) or tungsten (W) or semiconductor with low resistance is employed as contact electrode metal after forming a thin titanium nitride film 16a. Thus, the bit line contact electrode 16 connected to the bit line contact diffusion layer 5d and the source line contact electrode 16 connected to the source line contact diffusion layer 5s can be formed.

Figure 16:
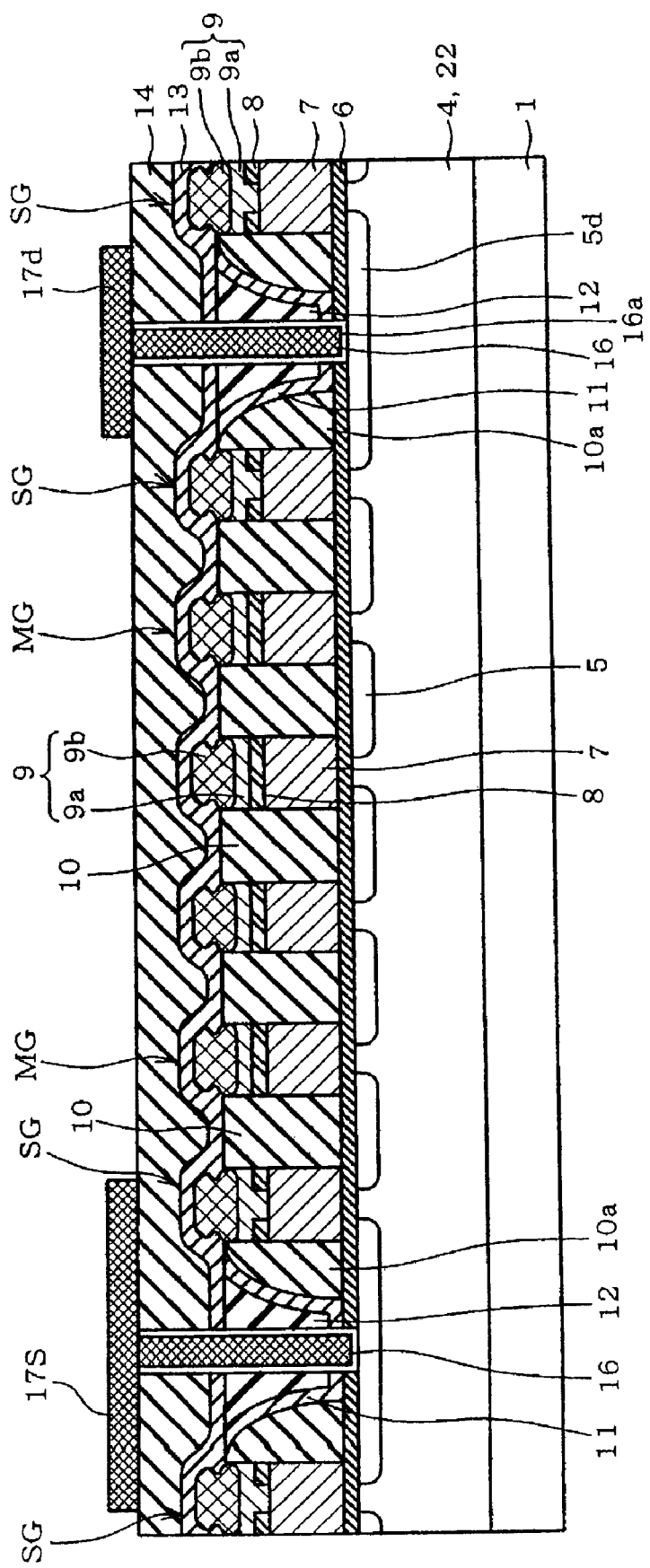
FIG. 16 is a schematic vertical cross sectional view showing one phase of a manufacturing step ($13^{th}$ variation)

Then, as illustrated in FIG. 16, a first interconnect metal 17 is deposited on the first interlayer insulating film 14 and patterned thereafter to form the bit line connection 17d connecting to the bit line contact electrode 16, and a first interconnect (source line) 17s connecting to the source line contact electrode 16. The materials used for the aforementioned contact electrode metal may be used for the first interconnect metal.

Next, a second interconnect is formed.

As illustrated in FIG. 3, the second interlayer insulating film 15 is formed entirely over the first interlayer insulating film 14, the bit line connection 17d and the first interconnect (source line) 17s. As described in the aforementioned steps, a second contact hole penetrating to the bit line connection 17d is defined in the second interlayer insulating film 15. The second contact hole is subsequently filled with contact electrode metal to form an inter-interconnect contact electrode 18. A second interconnect metal 19 is deposited further on top and patterned thereafter, thereby forming the second interconnect (bit line) 19 connecting to the inter-interconnect contact electrode 18. The second interconnect (bit line) 19 is connected to the bit line contact diffusion layer 5d via the inter-interconnect electrode 18, the bit line connection 17d, and the bit line contact electrode 16 as described above.

Thereafter, steps such as multilayer interconnecting required for semiconductor devices are performed to complete manufacturing of the NAND semiconductor storage device of the present embodiment.

Figure 18:
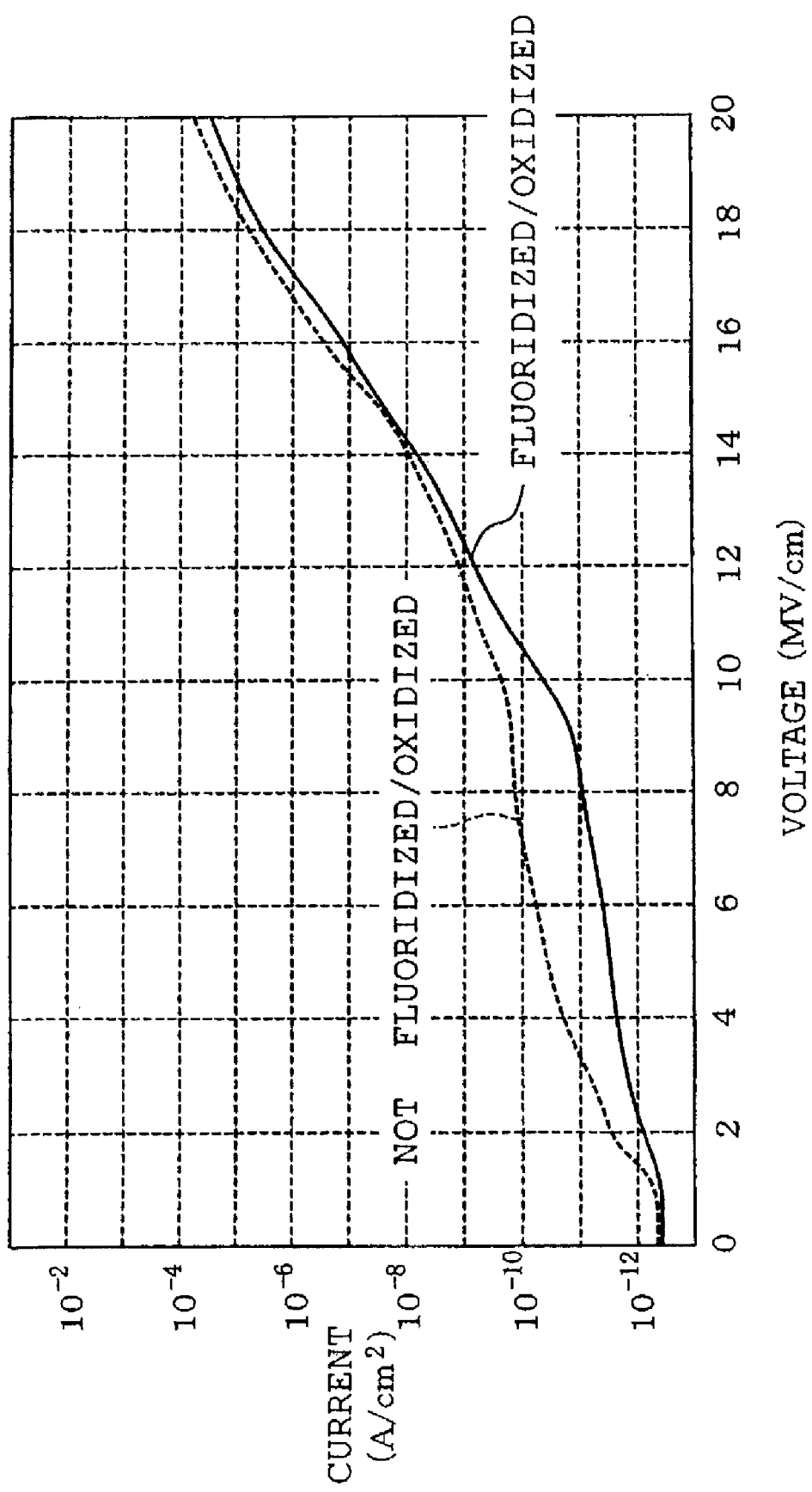
FIG. 18 is a chart indicating an electrical property.

As described above, the experiment conducted in the present embodiment has proved that electrical property of the semiconductor device can be improved through reduction in leak current as well as improvement in breakdown voltage properties by performing fluoridizing/oxidizing process on the exposed portion of the second conductive film 9a. Actual measurement of current-voltage properties is depicted in FIG. 18. The result of fluoridization/oxidization process is indicated in solid line and result of no fluoridization/oxidization process is indicated in broken line. Both cases are represented by a single line; however, each line represents an average value of multiple samples of data.

The present disclosure is not limited to the above described embodiments but may be modified or expanded as follows.

The NAND memory cell array of the present disclosure is configured by four memory cell transistors Trm intervening the select gate transistors Trs1 and Trs2; however the number of memory cell transistors is not limited to four but may be sixteen or thirty-two or other given numbers.

The carbon tetrafluoride ($CF_4$) gas used in fluoridizing/oxidizing the polycrystalline silicon surface by plasma is interchangable with fluoromethane ($C_xF_y$) based gas, and oxygen ($O_2$) gas may be vaporized water ($H_2O$) or active $H_2O$ (radical) formed by high temperature catalyctic reaction of hydrogen gas and oxygen gas to provide the same results observed in the aforementioned embodiment.

The step of fluoridizing/oxidizing the polycrystalline silicon surface by plasma may employ either of ammonia ($NH_3$) gas or hydrogen ($H_2$) gas, and either of hydrogen fluoride (HF) gas, trifluoronitride ($NF_3$) gas, fluoride ($F_2$) gas, or sulfur hexafluoride ($SF_6$) gas, and the plasma used may be a surface wave plasma or remote plasma. When using the surface wave plasma, the trifluoronitride ($NF_3$) may be introduced without being exposed to plasma. Also, anneal performed in the temperature range of 150 degrees to 350 degrees Celsius after the fluoridizing/oxidizing step will provide similar results.

Fluoridizing/oxidizing step of polycrystalline silicon surface will achieve similar effects when the wafer is left under a humidity of 50% or greater for one day or longer before forming cobalt (Co)/titanium (Ti)/titanium nitride (TiN) film.

Using Nickel (Ni), platinum (Pt), titanium (Ti), tantalum (Ta), or tungsten (W) as the metal for silicide layer formation will also provide similar effects.

The foregoing description and drawings are merely illustrative of the principles of the present disclosure and are not to be construed in a limited sense. Various changes and modifications will become apparent to those of ordinary skill in the art. All such changes and modifications are seen to fall within the scope of the disclosure as defined by the appended claims.

What is claimed is:

1. A method of manufacturing a semiconductor device, comprising:
    forming a first conductive film on a semiconductor substrate via a first insulating film;
    forming a second conductive film on the first conductive film via a second insulating film;
    patterning the first and the second conductive films and the second insulating film to form a plurality of gate electrodes;
    filling a third insulating film between the plurality of gate electrodes;
    exposing an upper portion of the second conductive film by removing the third insulating film;
    covering at least one surface of the exposed upper portion of the second conductive film with fluoride (F) or carbon (C) or oxygen (O);
    forming a metal film on an upper surface of the second conductive film; and
    forming a silicide layer on the upper portion of the second conductive film by thermally treating the metal film such that a constriction is formed between an upper surface and a lower surface of the silicide layer, the constriction having a narrower width than the upper surface and the lower surface.

2. The method of claim 1, wherein the forming the silicide layer forms an upper surface width of the silicide layer to be narrower than a lower surface width thereof.

3. The method of claim 1, wherein the covering the exposed surfaces further comprises introducing at least one or a combination of $CF_4$, $C_xF_y$, $O_2$, CO, and $H_2O$ gas into a plasma.

4. The method of claim 1, wherein the covering the exposed surfaces further comprises placing the exposed surfaces to a remote plasma or a surface wave plasma atmosphere comprising at least one or a combination of $NH_3$, $H_2$, $H_2O$, $NF_3$, $SF_6$, and $F_2$ gas, and thermally treating the exposed surfaces.

5. The method of claim 4, wherein the thermal treatment is performed in a temperature range of from 150 degrees to 350 degrees Celsius.

6. The method of claim 1, wherein the silicide layer includes either a cobalt silicide film, a nickel silicide film, a platinum silicide film, a titanium silicide film, or a tantalum silicide film.

7. The method of claim 1, wherein the first conductive film includes a polycrystalline silicon film.

8. The method of claim 1, wherein the first insulating film includes a silicon oxide film.

9. The method of claim 1, wherein the second conductive film includes a polycrystalline silicon film.

10. The method of claim 1, wherein the second insulating film includes a pair of silicon oxide films and a silicon nitride film located between the silicon oxide films.

11. The method of claim 1, wherein the third insulating film includes a tetraethyl orthosilicate film based silicon oxide film.

12. The method of claim 1, further comprising forming diffusion layers in the semiconductor substrate after the patterning.

13. The method of claim 1, wherein the exposing exposes an upper surface and an upper side surface of the second conductive film.

14. The method of claim 13, wherein a height of an upper surface of the removed third insulating film in the exposing is higher than a boundary of the second insulating film and the second conductive film.

15. The method of claim 1, further comprising thermally treating after forming the silicide layer so as to form a disilicide layer.

16. A method of manufacturing a semiconductor device, comprising:
    forming a first conductive film on a semiconductor substrate via a first insulating film;
    forming a second conductive film on the first conductive film via a second insulating film;

patterning the first and the second conductive films and the second insulating film to form a plurality of gate electrodes;

filling a third insulating film between the plurality of gate electrodes;

exposing an upper portion of the second conductive film by removing the third insulating film;

covering at least one surface of the exposed upper portion of the second conductive film with fluoride (F) or carbon (C) or oxygen (O);

forming a metal film on an upper surface of the second conductive film;

forming a silicide layer on the upper portion of the second conductive film by thermally treating the metal film;

wherein the exposing exposes an upper surface and an upper side surface of the second conductive film; and wherein a height of an upper surface of the removed third insulating film in the exposing is higher than a boundary of the second insulating film and the second conductive film.

* * * * *